(12) United States Patent
Ogawa et al.

(10) Patent No.: US 8,399,357 B2
(45) Date of Patent: Mar. 19, 2013

(54) METHOD OF MANUFACTURING SEMICONDUCTOR DEVICE

(75) Inventors: Yoshihiro Ogawa, Mie (JP); Tatsuhiko Koide, Mie (JP); Shinsuke Kimura, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 13/238,997

(22) Filed: Sep. 21, 2011

(65) Prior Publication Data

US 2012/0088357 A1 Apr. 12, 2012

(30) Foreign Application Priority Data

Oct. 6, 2010 (JP) .................................. 2010-226513

(51) Int. Cl.
*H01L 21/44* (2006.01)

(52) U.S. Cl. ................. 438/671; 257/E21.229

(58) Field of Classification Search .................. 438/671; 257/E21.224, E21.229, E21.233
See application file for complete search history.

(56) References Cited

U.S. PATENT DOCUMENTS

| | | | | |
|---|---|---|---|---|
| 6,723,607 | B2 * | 4/2004 | Nam et al. ..................... | 438/275 |
| 7,604,926 | B2 | 10/2009 | Kamigaki et al. | |
| 7,638,267 | B2 * | 12/2009 | Chiba et al. ................... | 430/330 |
| 2002/0174882 | A1 | 11/2002 | Kimura | |
| 2009/0311874 | A1 | 12/2009 | Tomita et al. | |
| 2011/0139192 | A1 | 6/2011 | Koide et al. | |
| 2011/0143541 | A1 | 6/2011 | Ogawa et al. | |
| 2011/0143545 | A1 | 6/2011 | Okuchi et al. | |

FOREIGN PATENT DOCUMENTS

| | | |
|---|---|---|
| JP | 2008-041722 | 2/2008 |
| JP | 2008-260931 | 10/2008 |

OTHER PUBLICATIONS

Ogawa et al.; "Semiconductor Substrate Surface Treatment Method", U.S. Appl. No. 13/069,164, filed Mar. 22, 2011.

* cited by examiner

*Primary Examiner* — Chandra Chaudhari
(74) *Attorney, Agent, or Firm* — Finnegan, Henderson, Farabow, Garrett & Dunner, L.L.P.

(57) ABSTRACT

A method of manufacturing a semiconductor device is disclosed. The method forms a semiconductor device including a workpiece structure having a first region and second region located adjacent to the first region formed therein. The first region includes a first pattern and the second region includes a second pattern having at least a greater pattern width or a smaller aspect ratio than the first pattern. The method includes forming the first pattern by providing a first film having a first contact angle at a top portion thereof and the second pattern by providing a second film having a second contact angle less than the first contact angle at a top portion thereof; cleaning the first and the second regions by a chemical liquid; rinsing the cleaned first and the second regions by a rinse liquid; and drying the rinsed first and the second regions.

20 Claims, 12 Drawing Sheets

METHOD OF MANUFACTURING SEMICONDUCTOR DEVICE

CROSS-REFERENCE TO RELATED APPLICATION(S)

This application is based upon and claims the benefit of priority from Japanese Patent Application No. 2010-226513, filed on, Oct. 6, 2010 the entire contents of which are incorporated herein by reference.

FIELD

Embodiments disclosed herein generally relate to a method of manufacturing semiconductor device.

BACKGROUND

Driven by requirements for microfabrication, there are growing demands for methodologies for forming sublithographic patterns. One of such approaches is a sidewall transfer process in which a spacer pattern formed on the sidewall of a dummy pattern is utilized as mask for etching the underlying structure to form a finer pattern compared to the dummy pattern. When processing the spacer pattern into an etch mask, the dummy pattern interposing the spacer pattern is removed by wet etching which is followed by a drying process. Pattern collapse becomes an issue in the drying process when the lines of the spacer pattern are drawn together by the surface tension of the liquid such as chemicals and purified water residing between the lines of the spacer pattern.

One approach in attempt to prevent pattern collapse is IPA (Isopropyl Alcohol) drying in which purified water residing on the wafer is substituted by IPA which has less surface tension than purified water. However, even IPA has failed to prevent pattern collapse in fine features formed by methodologies described above.

DETAILED DESCRIPTION

In one embodiment, a method of manufacturing a semiconductor device is disclosed. The method forms a semiconductor device including a workpiece structure having a first region and second region located adjacent to the first region formed therein. The first region includes a first pattern and the second region includes a second pattern having at least a greater pattern width or a smaller aspect ratio than the first pattern. The method includes forming the first pattern by providing a first film having a first contact angle at a top portion thereof and the second pattern by providing a second film having a second contact angle less than the first contact angle at a top portion thereof; cleaning the first and the second regions by a chemical liquid; rinsing the cleaned first and the second regions by a rinse liquid; and drying the rinsed first and the second regions.

Embodiments are described hereinafter with references to the accompanying drawings to provide illustrations of the features of the embodiments. Elements that are identical or similar are represented by identical or similar reference symbols across the figures and are not redescribed. The drawings are not drawn to scale and thus, do not reflect the actual measurements of the features such as the correlation of thickness to planar dimensions and the relative thickness of different layers.

A first embodiment of the present disclosure will be described through formation of line and space (L/S) patterns exemplified in FIGS. 1A to 3, which is typically carried out in manufacturing a nonvolatile semiconductor storage device such as a NAND flash memory.

Figure 1A:
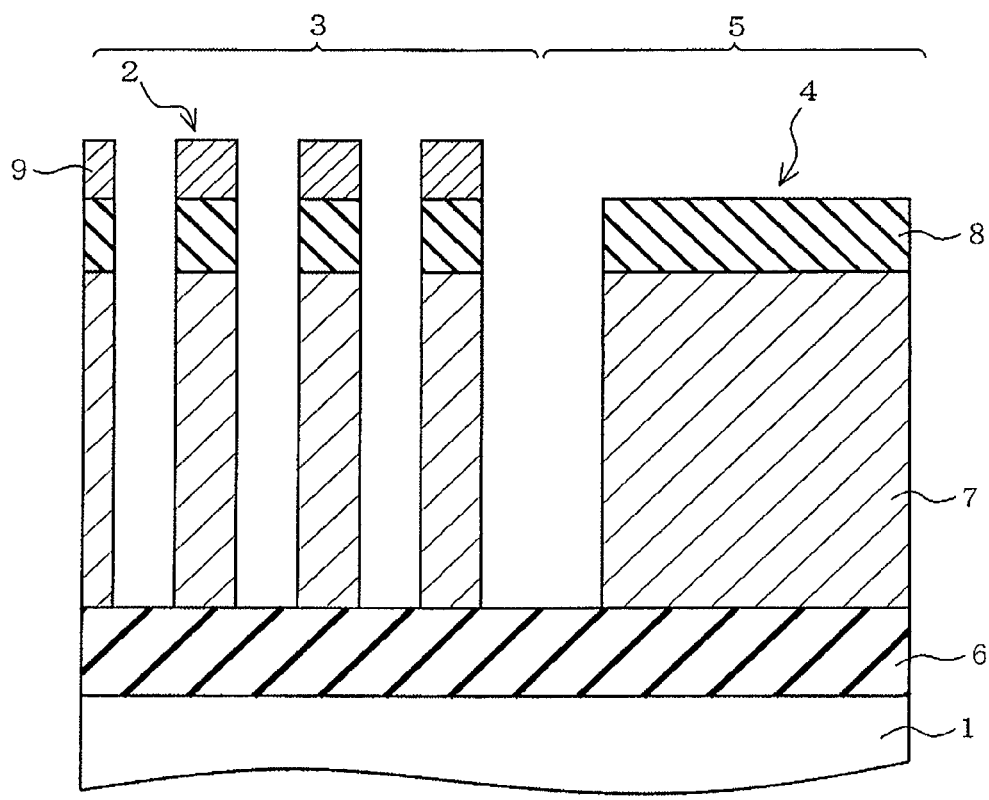
FIG. 1A is a schematic cross sectional view partially illustrating a structure of a first embodiment of the present disclosure.
Figure 1B:
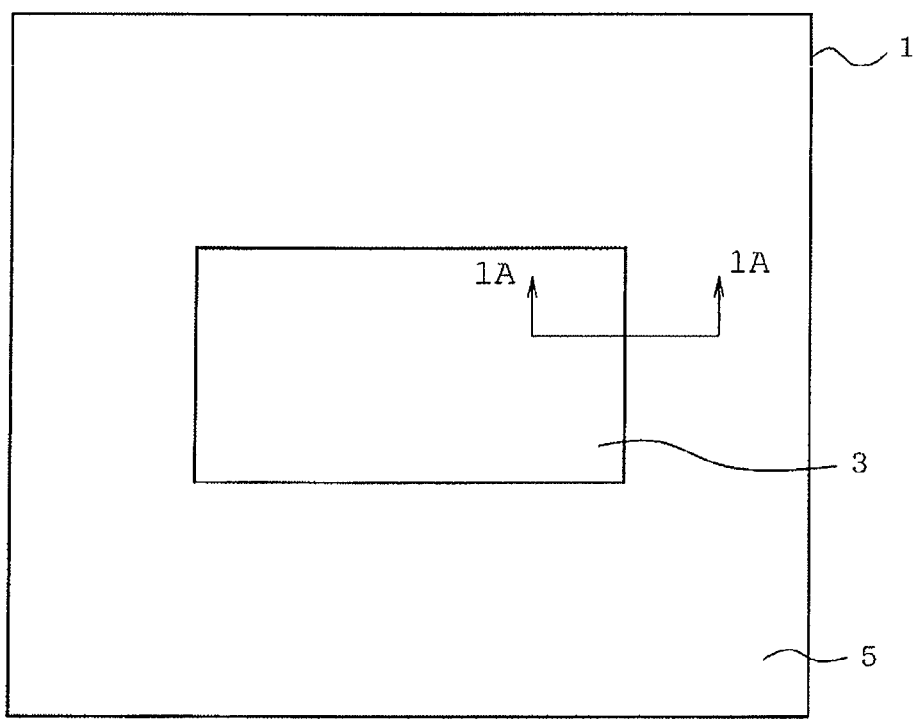
FIG. 1B is a planar layout of the structure.

FIGS. 1A and 1B each exemplifies a feature being subjected to the clean and dry steps of the first embodiment. FIG. 1A schematically illustrates the cross section taken along line 1A-1A OF FIG. 1B. FIG. 1B is a schematic plan view of the area in which the line and space pattern is formed. The substrate of the semiconductor device, exemplified as semiconductor substrate 1 in FIGS. 1A and 1B, is delineated into first region 3 in which a later described first pattern 2 is formed and second region 5 in which second pattern 4 is formed. As can be seen in the planar layout of FIG. 1B, both first and second regions 3 and 5 are rectangular regions and second region 5 is located adjacent to the first region 3 so as to embrace first region 3.

In the first embodiment, first pattern 2 is a fine L/S pattern having a pattern width of 30 nm or thinner and an aspect ratio of 8 or more. In another embodiment, first pattern 2 may have a pattern width greater than 30 nm and an aspect ratio of 8 or less. Second pattern 4 is configured to be wider in pattern width and smaller in aspect ratio as compared to first pattern 2.

When first and second patterns 2 and 4 are employed in a semiconductor device application such as a nonvolatile memory, first region 3 may correspond to a memory cell region in which multiplicity of memory transistors are formed and second region 5 may correspond to a peripheral circuit region which is typically disposed around the memory cell region. First region 3 may be divided into subsets in which case, each subset may be surrounded by a dedicated second region 5. Second pattern 4 being configured as electrically active circuit elements in the first embodiment may be configured as an electrically inactive dummy pattern in another embodiment.

Referring to FIG. 1A, the structure being subjected to the clean and the dry steps of the first embodiment includes semiconductor substrate such as a silicon substrate 1, insulating film 6 typically made of silicon oxide film formed above semiconductor substrate 1, and first and second patterns 2 and 4 formed above insulating film 6. First and second patterns 2 and 4 comprises workpiece film 7, typically comprising polycrystalline silicon film (Si), and second film 8, typically comprising a silicon oxide film ($SiO_2$) or a silicon nitride film (SiN), formed above workpiece film 7. First pattern 2 further has first film 9 typically made of polycrystalline silicon film formed above the second film 8, meaning that first pattern 2 has a stack of first and second films 9 and 8 provided above workpiece film 7.

Figure 3:
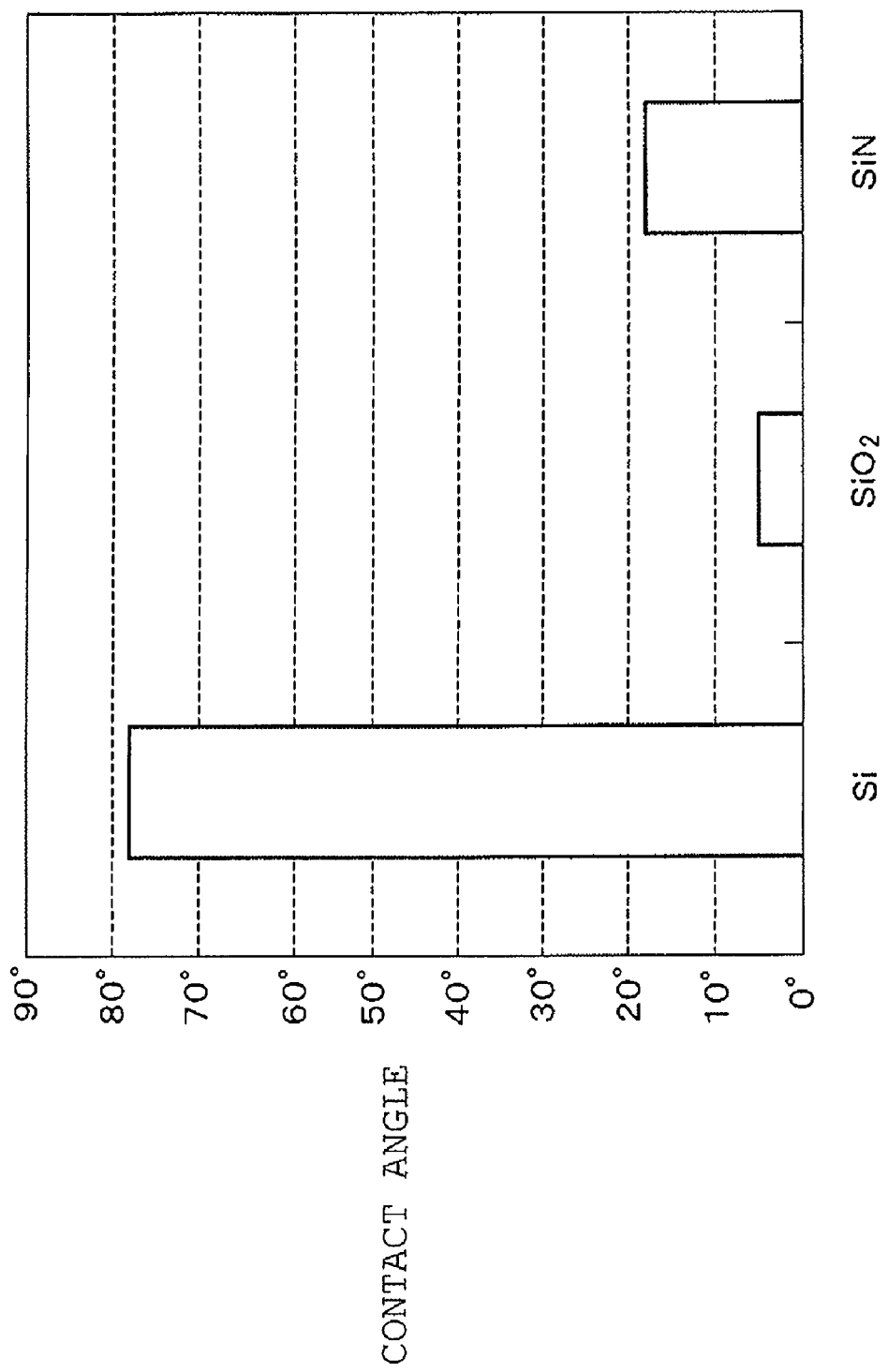
FIG. 3 is a chart indicating water contact angles of different types of films.

FIG. 3 is a chart indicating the water contact angles of first and second films 9 and 8 after they are treated by dilute hydrofluoric acid (DHF). As apparent from FIG. 3, silicon such as polycrystalline silicon, amorphous silicon, and single crystal silicon which are possible ingredients of first film 9 have a relatively large contact angle of approximately 78 degrees. To the contrary, silicon oxide film and silicon nitride film which may selectively serve as second film 8 have relatively small contact angles of 5 degrees and 18 degrees, respectively.

As described above, because the structure is configured to have a relatively large contact angle at the top or topmost portion of first pattern 2 and a relatively small contact angle at the top or topmost portion of second pattern 4, the rinse liquid is drawn toward second pattern 4 having a relatively small contact angle at its top portion making it difficult for liquid to remain locally in the first pattern 2. Accordingly, pattern collapse induced by surface tension of liquids such as rinse liquid can be prevented especially in first region 3 where fine first pattern 2 is formed. Pattern collapse of first pattern 2 can be prevented in the subsequent chemical clean step if the aforementioned relation in contact angles is maintained. Second pattern 4 is free of pattern collapse even if liquid remains on the pattern because its aspect ratio and pattern width are controlled at dimensions to tolerate the surface tension of the remaining liquid.

Next a description will be given on the formation of the structure illustrated in FIG. 1A and the clean and dry steps carried out for the same with reference to FIGS. 2A to 2C.

Figure 2A:
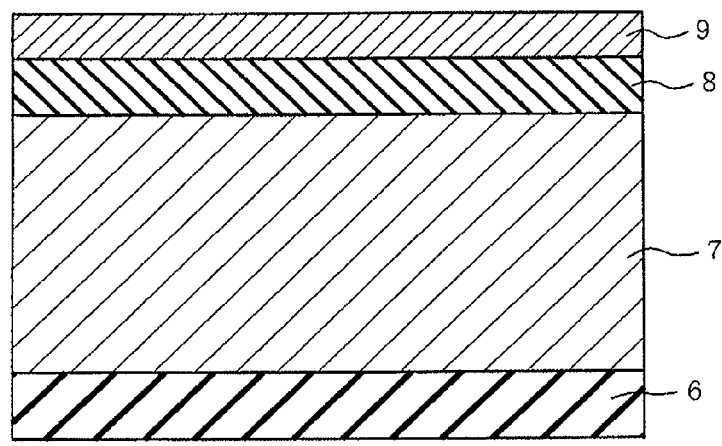
FIGS. 2A to 2C each provides a vertical cross sectional view of one phase of a manufacturing process flow of the first embodiment.

Referring first to FIG. 2A, insulating film 6, workpiece film 7, second film 8, and first film 9 are stacked in the listed sequence above semiconductor substrate 1 not shown in FIG. 2A. Insulating film 6 serves as an etch stopper when etching workpiece film 7 and thus has less etch selectivity to workpiece film 7.

Figure 2B:
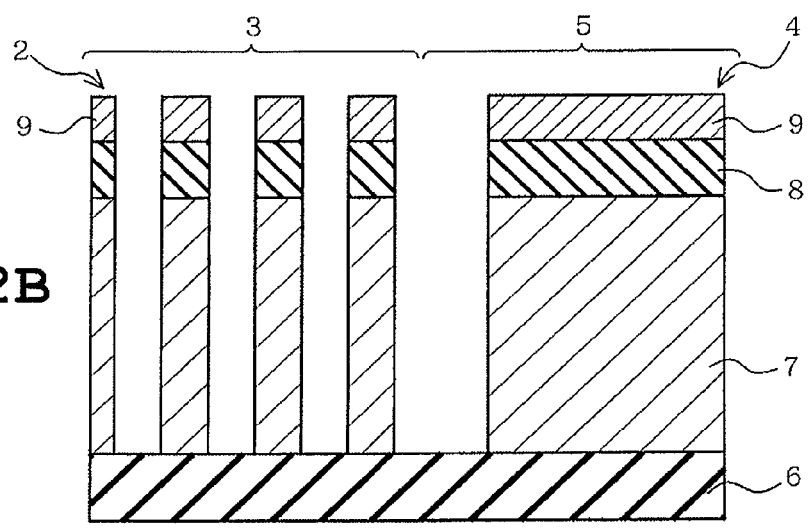

Then, referring to FIG. 2B, a resist or a mask is patterned by photolithography or sidewall transfer process whereafter first film 9, second film 8, and workpiece film 7 are dry etched typically by RIE (Reactive Ion Etching) using the patterned resist or the mask to obtain first pattern 2 and second pattern 4. Pattern collapse originating from surface tension is not observed at this stage in the fine first pattern 2 since it has not been immersed in liquid such as cleaning liquid.

Figure 2C:
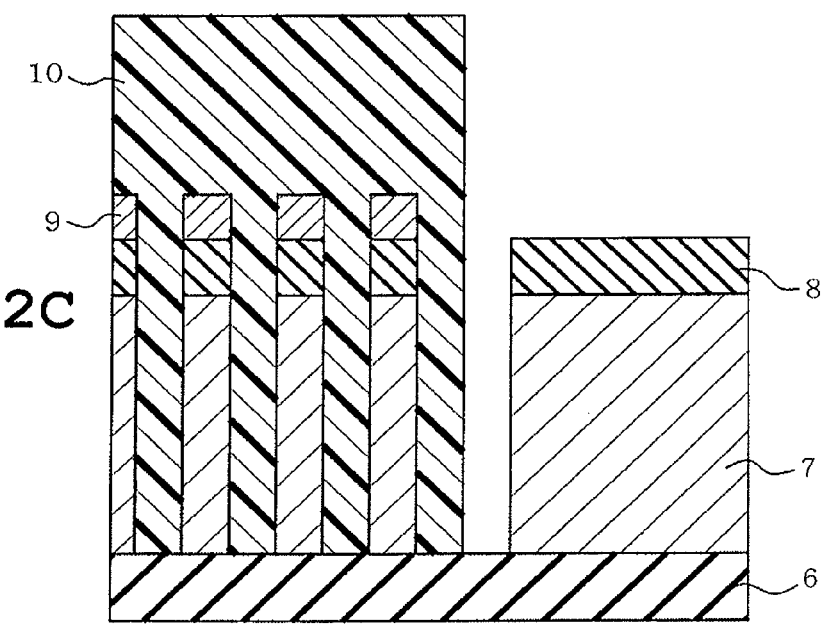

Next, as shown in FIG. 2C, resist film 10 is blanketed over the first and second regions 3 and 5, whereafter resist film 10 is patterned to expose the second region 5 while keeping first region 3 covered by photolithography. Pattern collapse is not observed at this stage as well even if the feature is wetted in the development process since first region 3 is covered by resist film 10. Then, using resist film 10 as a mask, first film 9 is removed from second pattern 4 by dry or wet etching to obtain first pattern 2 having first film 9 located at its top or topmost portion and second pattern 4 having second film 8 located at its top or topmost portion.

Thereafter, resist film 10 is removed by dry ashing or wet etching, followed by DHF cleaning and rinsing with rinse liquid. In case resist film 10 is removed by wet etching, the process proceeds to the next step with first and second patterns 2 and 4 immersed in the wet etch liquid without being dried. Removal of resist film 10 exposes first film 9 having a relatively large contact angle at the top portion of first pattern 2 and second film 8 having a relatively small contact angle at the top portion of second pattern 4. Proceeding consecutively from the removable of resist film 10, etch residues are removed by DHF cleaning and in the following rinsing, the rinse liquid is drawn toward second pattern 4 topped by second film 8 having relatively smaller contact angle to prevent the rinse liquid from remaining locally within the trenches of first pattern 2.

Because there is no rinse liquid remaining in the trenches of first pattern 2, pattern collapse originating from stress induced by surface tension can be prevented in the subsequent drying.

In the above described first embodiment, first film 9 having a relatively large contact angle is located at the top of first pattern 2 and second film 8 having a relatively small contact angle is located at the top of second pattern 4 which is disposed so as to surround first region 3 in which first pattern 2 is formed. As a result, collapse of first pattern 2 in the dry step can be prevented even when the rinse step and the dry step are carried out after formation of first and second patterns 2 and 4 because rinse liquid used in the rinse step is drawn toward second pattern 4 to prevent the rinse liquid from remaining locally in the first pattern 2.

Next a description will be given on a second embodiment with reference to FIGS. 4A to 9C.

Figure 4A:
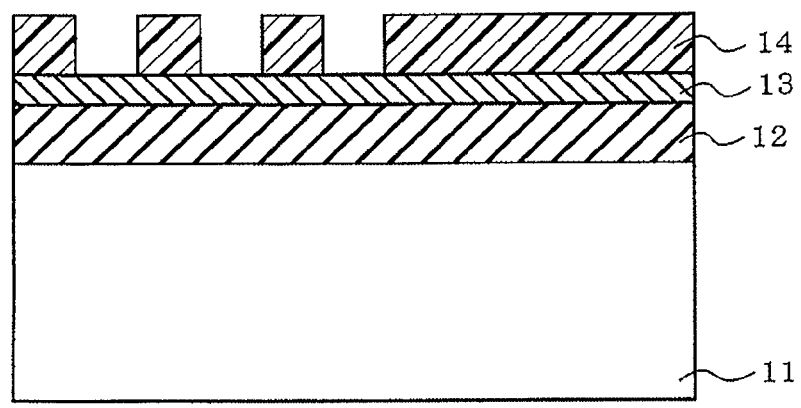
FIGS. 4A to 4C each provides a vertical cross sectional view of one phase of a manufacturing process flow of a second embodiment.

The second embodiment differs from the first embodiment in that silicon substrate 1 is the workpiece structure. As can be seen in FIG. 4A, first film 12 comprising a silicon nitride film and second film 13 comprising TEOS (Tetraethyl Orthosilicate) oxide film are stacked in the listed sequence above silicon substrate 1. Resist film 14 is coated above second film 13 and thereafter patterned into lines and spaces for forming first and second patterns 2 and 4. The thickness of second film 13 is controlled to a measurement which is greater than half the width of first pattern 2, and the width of second pattern 4 is controlled so as to be much wider than the width of first pattern 2. Resist film 14 may be patterned by a normal photolithography process or by sidewall transfer process.

Figure 4B:
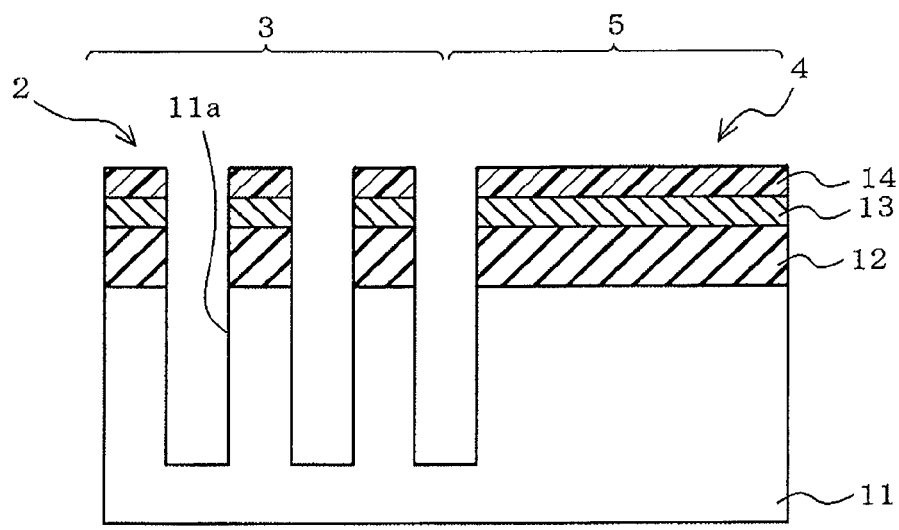
Figure 4C:
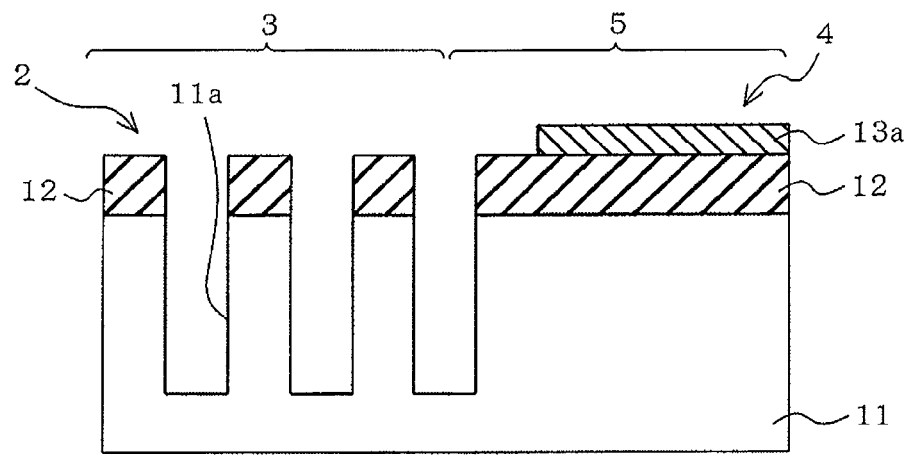

Next, as shown in FIG. 4B, trenches 11a are formed in a predetermined depth into second film 13, first film 12, and silicon substrate 1 by RIE.

Then, after removing resist film 14, second film 13 made of silicon oxide film is isotropically etched. Removing resist film 14 solely by SPM (sulfuric acid-hydrogen peroxide mixture) may cause pattern collapse of first pattern 2 during the spin drying that follows the rinse step, thus, DHF treatment is carried out after SPM treatment without any intervening dry steps. Thereafter, second film 13 in first pattern 2 is selectively removed by the isotropic etching whereas in second pattern 4, the edge of second film 13 is removed by isotropic etching to allow the rest of it to remain as second film 13a. Such topography is attributable to the aforementioned relation between the thickness of second film 13 and the width of first pattern 2.

As a result, the contact angle of first film 12 i.e. the silicon nitride film located at the top of first pattern 2 becomes relatively greater than the contact angle of second film 13a i.e. TEOS oxide film or more generally silicon oxide film, located at the top of second film as can be understood from the chart shown in FIG. 3, thereby preventing the collapse of first pattern 2 induced by surface tension during the process flow ranging from cleaning to drying as was the case in the first embodiment.

Next, a description will be given on a third embodiment of the present disclosure with reference to FIGS. 5A to 8. The third embodiment takes the approach of increasing the contact angle of the top portion of first pattern 2 through water repellent treatment. More specifically, the oxide film exposed at the top portion of the first pattern 2 is selectively silanized. The silanization is carried out by supplying silane coupling agent onto the surface of first pattern 2 to cause a silane coupling reaction to obtain a water repellent surface.

Figure 6:
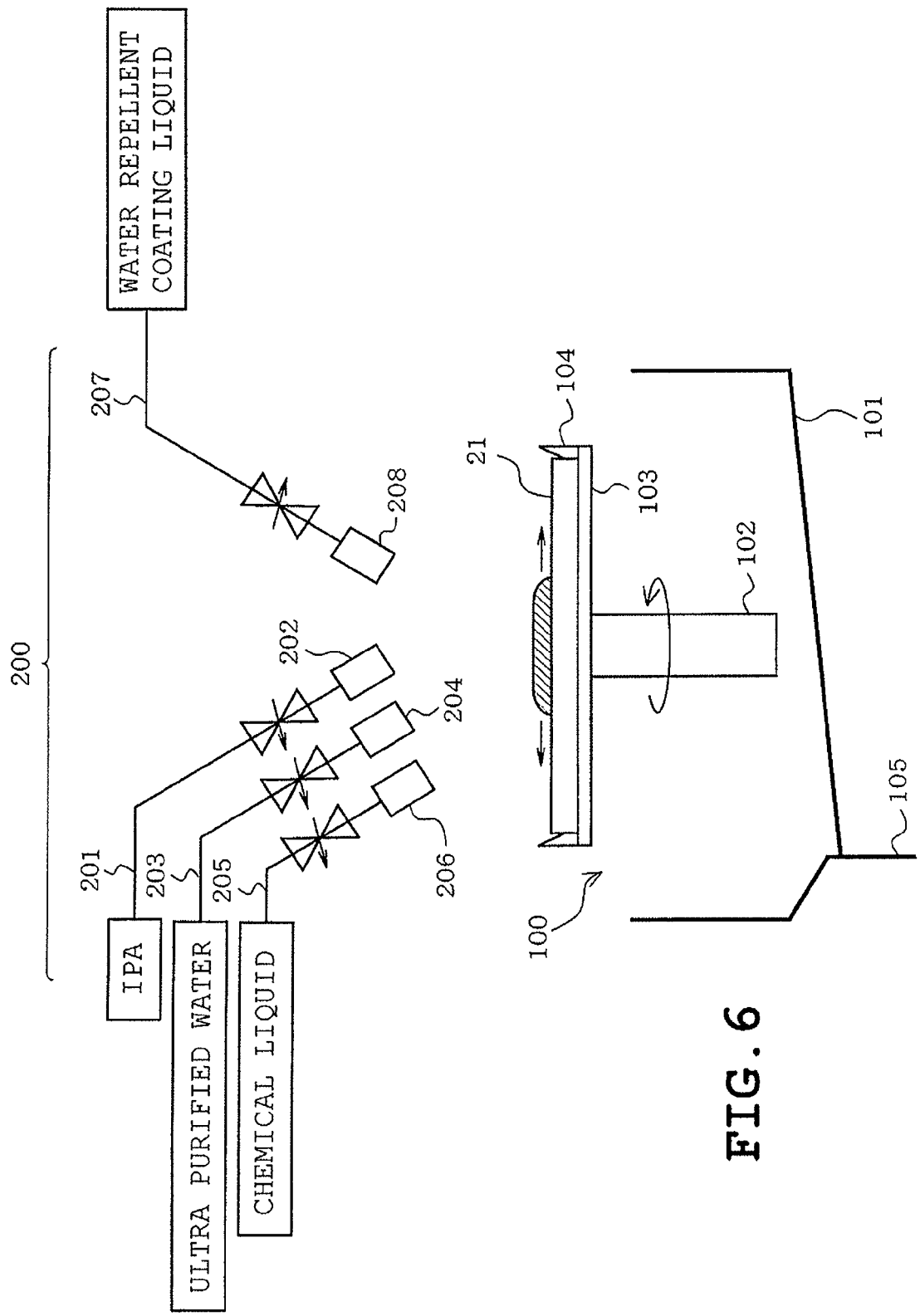
FIG. 6 schematically illustrates the configuration of a surface treatment apparatus of the third embodiment for processing a semiconductor substrate.

The third embodiment employs a surface treatment apparatus, more generally referred to as cleaning apparatus, illustrated in FIG. 6 to perform the silanization process. The surface treatment apparatus is configured primarily by rotary stage 100 and liquid supplier 200. Rotary stage 100 comprises spin base 103, rotary shaft 102 rotatably supporting spin base 103, and chuck pins 104 provided on spin base 103 and is disposed within the processing chamber configured as spin cup 101. Rotary shaft 102 extends substantially upright and has a round spin base 103 mounted on its upper end. Rotary shaft 102 and spin base 103 are driven in rotation by a motor not shown. Chuck pins 104 are provided on the peripheral edge of spin base 103 and holds silicon substrate 21 in which semiconductor devices are formed.

Liquid supplier 200 supplies chemical liquid onto the center of silicon substrate 21 placed on spin base 103. The supplied liquid includes cleaning liquid for removing etch residue, particles, and metal, silane coupling agent such as HMDS (hexamethyldisilazane) used in water repellent treatment, ultra purified water, and solvents such as IPA (Isopropylalcohol) and hydrofluoroether (HFE). IPA is supplied through supply tube 201 and discharged onto silicon substrate 21 from nozzle 202. Ultra purified water is supplied through supply tube 203 and discharged onto silicon substrate 21 through nozzle 204.

The cleaning liquids supplied through the surface treatment apparatus include but not limited to chemicals such as DHF, SC1 (standard clean 1) comprising an aqueous solution of ammonium hydroxide and hydrogen peroxide, SC2 (standard clean 2) comprising an aqueous solution of hydrochloric acid and hydrogen peroxide, and SPM. Two or more types of chemical liquids may be supplied simultaneously or consecutively. The chemical liquids are supplied through supply tube 205 and are discharged onto silicon substrate 21 from nozzle 206. Silane coupling agent is supplied through supply tube 207 and is discharged onto silicon substrate 21 from nozzle 208. Though not shown, an excimer UV unit is provided for removing the water repellent protective film formed on silicon substrate 21.

In operation, silicon substrate 21 is placed on spin base 103 and is chucked by chuck pins 104. Then, liquid supplied from liquid supplier 200 is poured onto the central portion of the spinning silicon substrate 21 to allow the supplied liquid to spread radially. Rotary stage 100 is also capable of spin drying. When spin drying, excess liquid being radially spun off of silicon substrate 21 is collected by spin cup 101 and exhausted from drain tube 105.

Figure 7:
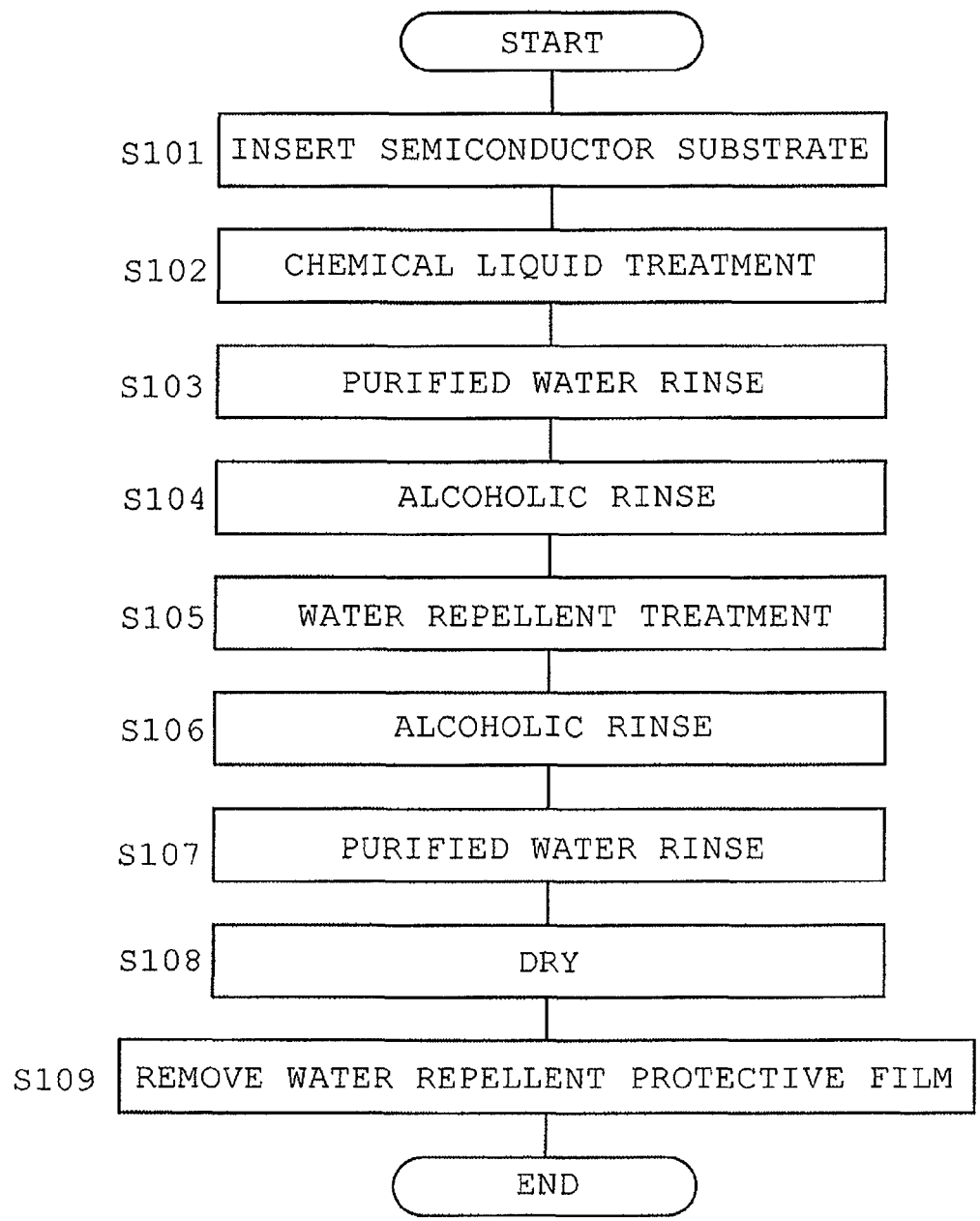
FIG. 7 is a simplified flowchart of treatments applied to the semiconductor substrate of the third embodiment.

Next, the process flow of the clean, rinse, water repellent treatment, and dry steps performed using the surface treatment apparatus is described based on the flowchart indicated in FIG. 7.

The process begins with inserting silicon substrate 21 into surface treatment apparatus (S101). As described earlier, silicon substrate 21 is placed on spin base 103 and chucked by chuck pins 104. Silicon substrate 21 has first and second patterns 2 and 4 formed above it by RIE prior to being introduced into the surface treatment apparatus.

Then, chemical treatment, which is mostly cleaning, is carried out on silicon substrate 21 (102). The cleaning liquids described earlier are supplied onto silicon substrate 21 from liquid supplier 200. Thereafter, silicon substrate 21 is rinsed consecutively by ultra purified water (S103) and IPA (S104) supplied from liquid supplier 200 so as to stay wet throughout the rinse steps.

Then, water repellent treatment (105) is performed on the upper surface of silicon substrate 21 wetted by IPA which is followed by another alcoholic rinse (S106) and purified water rinse (S107). The top portion of first pattern 2 formed above silicon substrate 21 is thus, selectively rendered water repellent through formation of a water repellent protective film so as to have a greater contact angle as compared to the top portion of second pattern 4. Thus, liquid is drawn toward second pattern 4 and does not remain in first pattern 2. As a result, the subsequent dry step (S108) is carried out without encountering pattern collapse induced by surface tension. By carrying out an excimer UV process not shown within the surface treatment apparatus, the water repellent protective film is removed (S109) to obtain a clean surface.

Figure 8:
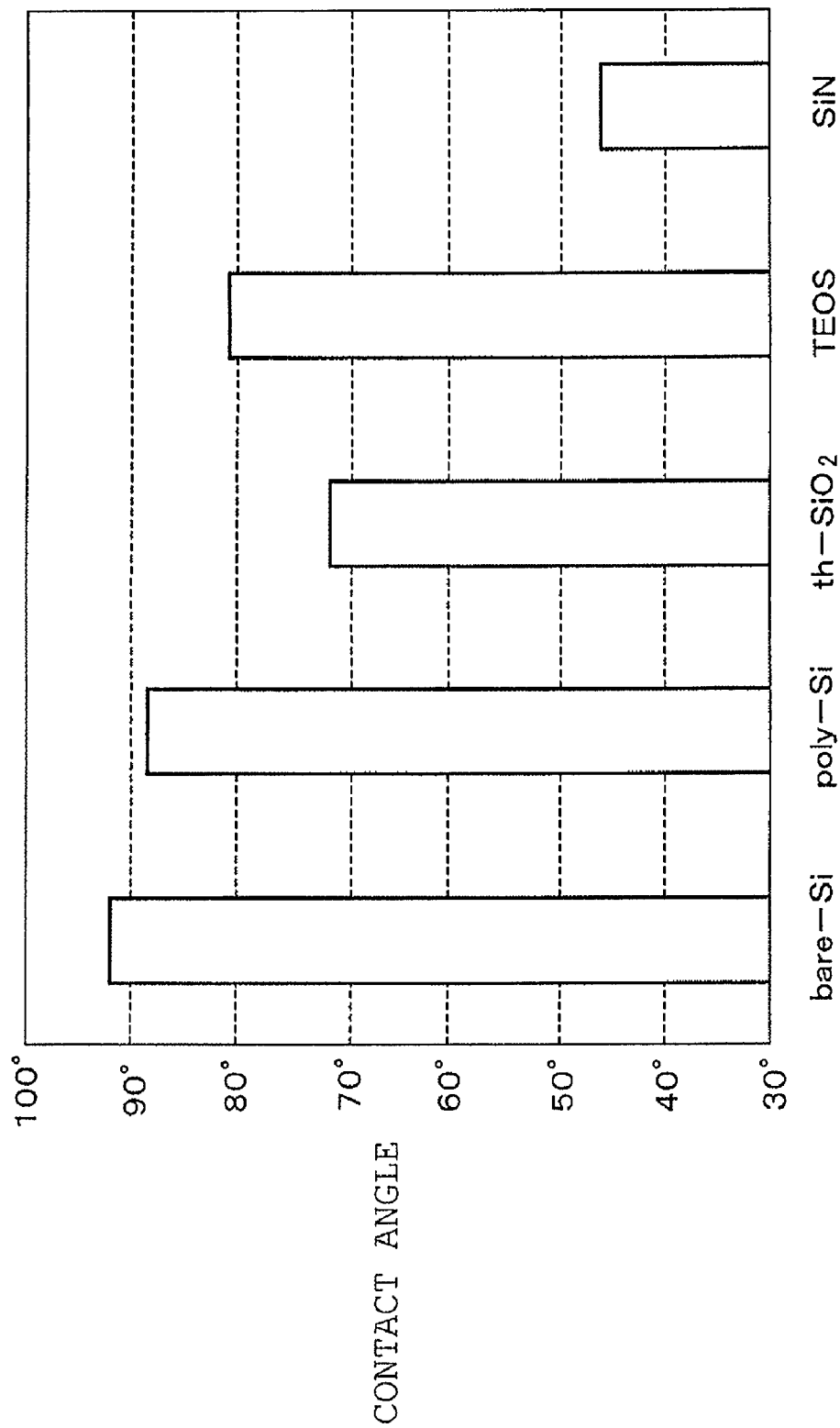
FIG. 8 is a chart indicating the water contact angles of different types of films after a water repellent treatment of the third embodiment.

FIG. 8 is a chart indicating the measurements of water contact angles of different types of films, after they were subjected to the above described water repellent treatment and dried. The film types being measured are bare silicon (bare Si), polycrystalline silicon (Poly-Si), thermal silicon oxide film (th-SiO$_2$), TEOS oxide film (TEOS), and silicon nitride film (SiN). As can be understood by comparison with FIG. 3 of the first embodiment indicating the original contact angles of some of the films given in FIG. 8, silicon oxide film which originally measured 5 degrees has been increased to be greater than 70 degrees in thermal silicon oxide and greater than 80 degrees in TEOS oxide film. Silicon nitride film which originally measured 18 degrees has been increased to approximately 46 degrees. The results show that silicon oxide based films which had smaller contact angles than silicon nitride based films prior to water repellent treatment was modified to indicate greater contact angles than silicon nitride based films after the water repellent treatment.

Figure 5A:
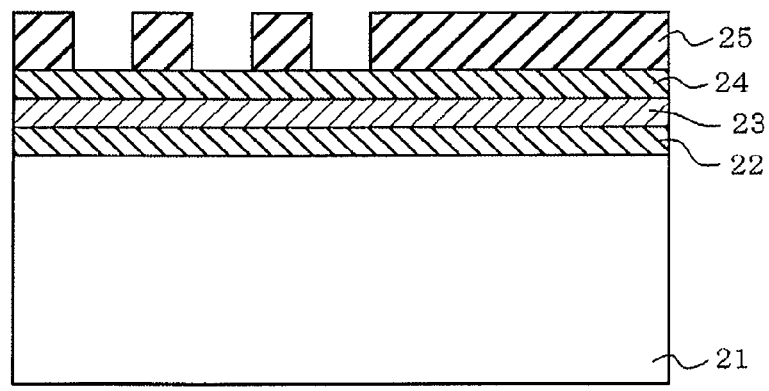
FIGS. 5A to 5C each provides a vertical cross sectional view of one phase of a manufacturing process flow of a third embodiment.
Figure 5B:
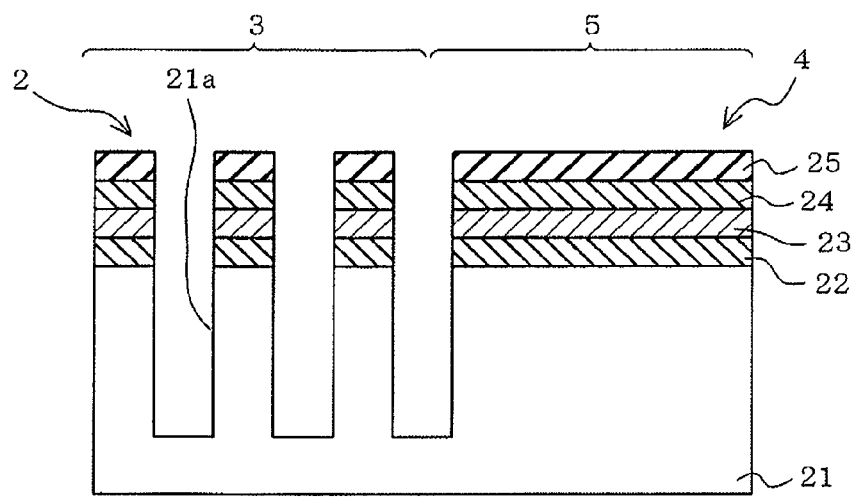
Figure 5C:
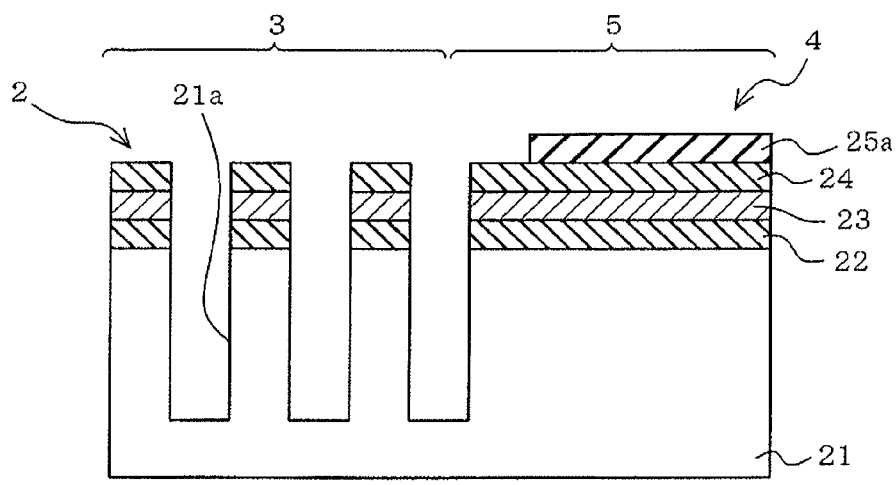

Referring now to FIGS. 5A to 5C, the workpiece structure being subjected to the above described process will be described in detail.

As shown in FIG. 5A, silicon oxide film 22, polycrystalline silicon film 23, silicon oxide film 24, and low temperature silicon nitride film 25 are stacked in the listed sequence above semiconductor substrate 21. Silicon nitride film 25 serves as a hard mask which is patterned into the shapes of first pattern 2 and second pattern 4 by a photolithography process or other methodologies such as sidewall transfer process and is controlled to a thickness greater than half the width of first pattern 2.

Next, as shown in FIG. 5B, silicon nitride film 25, silicon oxide film 24, polycrystalline silicon film 23, and silicon oxide film 22, and silicon substrate 21 are etched by RIE using the patterned hard mask to form trench 21a having a predetermined depth. The forgoing steps are carried out prior to S101 in which silicon substrate 21 is inserted into the surface treatment apparatus.

Then, as shown in FIG. 5C, etch residues such as etch deposits are removed in chemical liquid process (S102) using DHF. In S102, lower temperature silicon nitride film 25 serving as the second film exposed at the top portion of first pattern 2 is isotropically etched away while silicon nitride film 25 exposed at the top portion of second pattern 4 partially remains as silicon oxide film 25*a*. As a result, silicon oxide film 24 is located at the top portion of first pattern 2, whereas silicon nitride film 25*a* is located at the top portion of second pattern 4.

At this stage, the contact angle of silicon oxide film 24 at the top portion of first pattern 2 is smaller than the contact angle of silicon nitride film 25*a* at the top portion of second pattern 4. After the subsequent purified water rinse (S103) and alcoholic rinse (S104), DHF process is carried out which is followed by the water repellent treatment (S105) comprising silanization using silane coupling agent. Thus, silicon oxide film 24 is selectively rendered highly water repellent, which means that the contact angle of the top portion of first pattern 2 becomes greater than the contact angle of the top portion of second pattern 4 to transform silicon oxide film 24 into the first film. Thereafter, by performing the dry step (S108) after the alcoholic rinse step (S106) and purified water rinse step (S107), pattern collapse of first pattern 2 can be prevented during the dry step (S108).

In the third embodiment, silicon oxide film 24 at the top portion of first pattern 2 is modified through water repellent treatment to have greater contact angle as compared to silicon nitride film 25*a* at the top portion of second pattern 4. This means that a film originally located at the top portion of first pattern 2 having smaller contact angle than the film located at the top portion of second pattern 4 can be controlled to have a contact angle greater than the film located at the top portion of second pattern 4. Thus, pattern collapse of first pattern 2 can be made less dependent on film type, thereby improving the flexibility of the overall process flow.

Next, a description will be given on a fourth embodiment of the present disclosure with reference to FIGS. 9A to 10. The fourth embodiment differs from the third embodiment in that an oxidation treatment precedes the water repellent treatment described in the third embodiment to facilitate the variation in the contact angle through the water repellent treatment of the surfaces of the silicon films and silicon nitride films.

In addition to the surface treatment apparatus illustrated in FIG. 6, the surface treatment apparatus of the fourth embodiment is provided with liquid supplier 200 further incorporating a supply tube and a nozzle for supplying a development liquid as well as a nozzle for supplying oxidation agent for the oxidation treatment.

Chemicals used as an oxidation agent include chemical liquids that dissolve the resist at an extremely slow speed and thus, substantially do not dissolve the resist. Examples of such chemical liquids are SC1, SC2, sulfuric acid ($H_2SO_4$), a solution of hydrogen peroxide ($H_2O_2$), and an ozone solution which is 10 ppm or less. The oxidation treatment is effective when the oxidized film is a non-silicon oxide film such as a polycrystalline silicon film, an amorphous silicon film, and silicon nitride film. By exposing first pattern 2 and selectively oxidizing the same prior to the water repellent treatment, water repellent treatment of the oxidized first pattern 2 is selectively promoted even if water repellent treatment is subsequently carried out for both first and second patterns 2 and 4 to increase the contact angle of the top portion of first pattern 2.

Figure 9A:
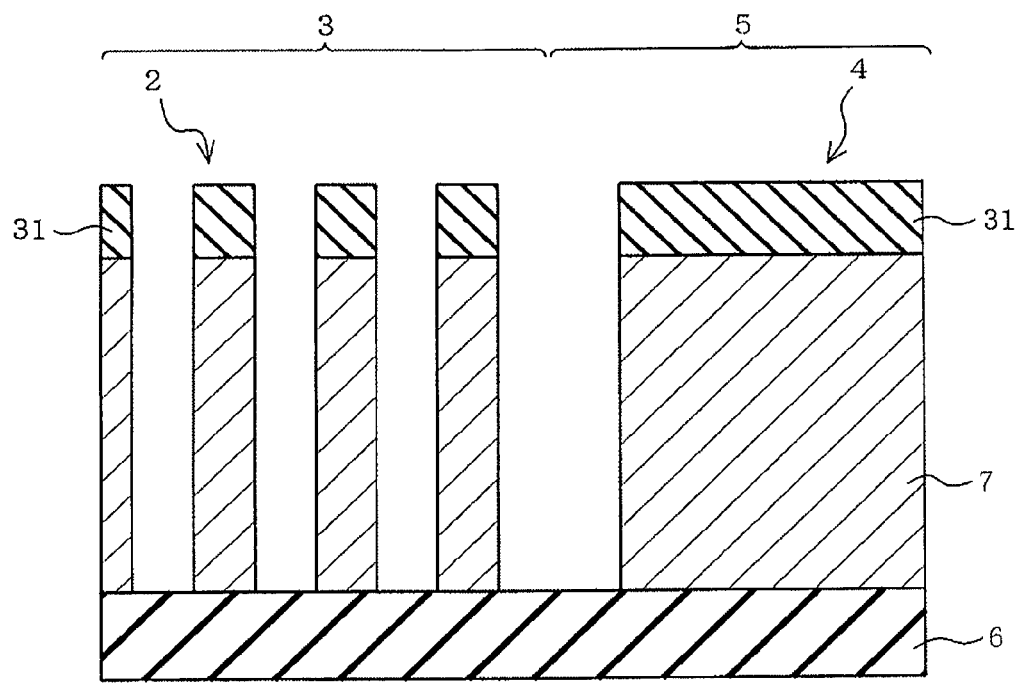
FIGS. 9A and 9B each provides a vertical cross sectional view of one phase of a manufacturing process flow of a fourth embodiment.
Figure 9B:
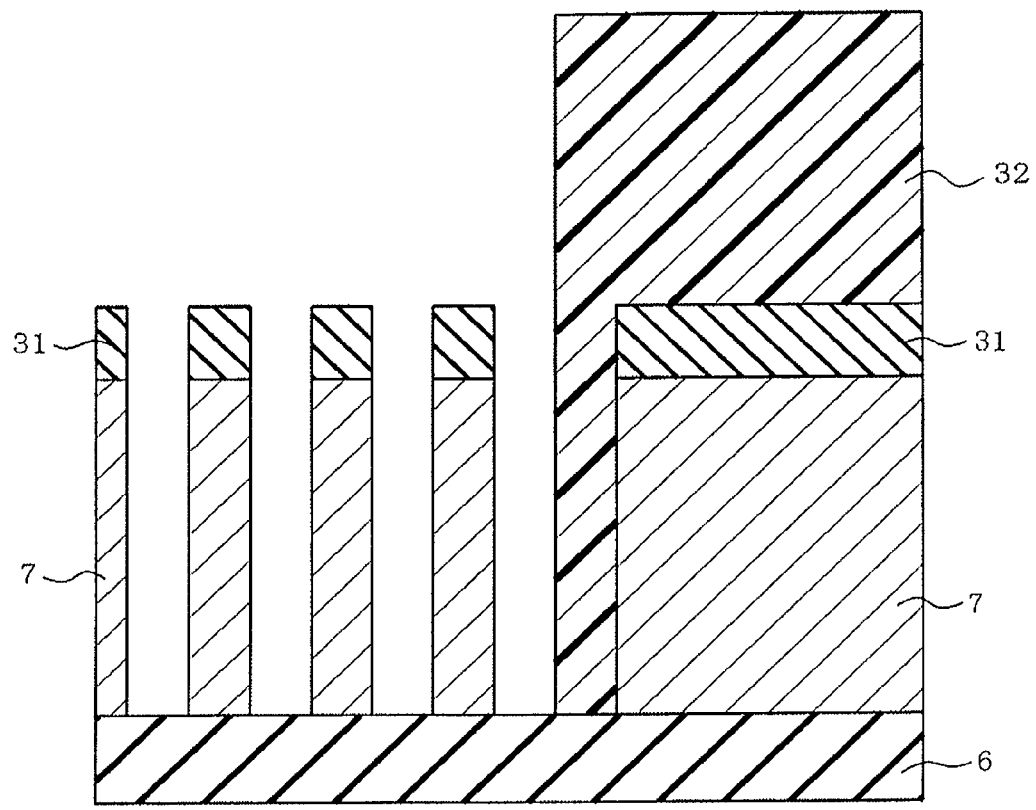
Figure 10:
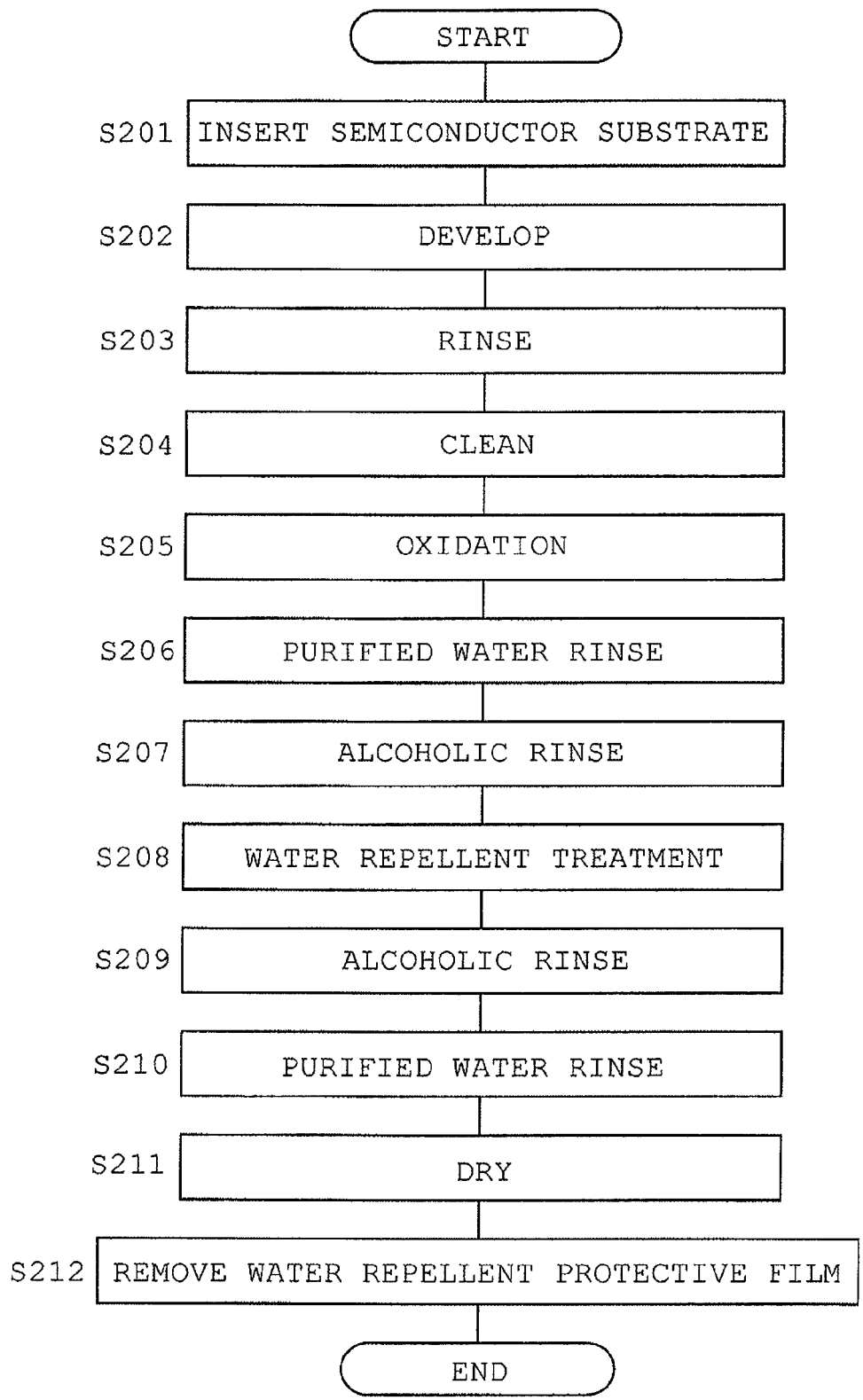
FIG. 10 is a simplified flowchart of treatments applied to the semiconductor substrate of the fourth embodiment.

Next, the process flow employed in the fourth embodiment will be briefly described through the structures illustrated in FIGS. 9A and 9B and described in a step by step manner based on the flowchart indicated in FIG. 10.

FIG. 9A shows a structure similar to the first embodiment. In the fourth embodiment, insulating film 6 typically made of silicon oxide film is formed above a semiconductor substrate such as a silicon substrate, and first and second patterns 2 and 4 are formed above insulating film 6 as was the case in the first embodiment. First and second patterns 2 and 4 include workpiece film 7 typically comprising polycrystalline silicon film and silicon nitride film 31 formed above workpiece film 7.

Silicon nitride film 31, being subjected to the later described steps, is modified such that the top portion of first pattern 2 is selectively increased in contact angle to serve as the first film, whereas the contact angle at the top portion of the second pattern 4 approximates the measurement of contact angle inherently possessed by a silicon nitride film to serve as the second film.

FIG. 9A illustrates the state of the semiconductor substrate ready for insertion into the surface treatment apparatus (S201) as indicated in the flowchart of FIG. 10. The structure of FIG. 9A is obtained by the following. A resist is formed above the aforementioned stack of films and patterned by photolithography or sidewall transfer process. Then, using the patterned resist as a mask, silicon nitride film 31 and workpiece film 7 are subjected to RIE to form first and second patterns 2 and 4. Next, using photolithography process, resist film 32 is coated and exposed by light such that second pattern 4 stays covered and first pattern 2 is exposed after development carried out later in the process flow. The above described steps are carried out prior to insertion of the semiconductor substrate into the surface treatment apparatus. The exposed semiconductor substrate, which is yet to be developed, is placed on spin base 103 of the surface treatment apparatus and secured by chuck pins 104.

Then, as shown in FIG. 9B, development (S202) and rinsing (S203) is carried out such that resist film 32 is patterned to expose first pattern 2, while covering second pattern 4. More specifically, the development (S202) removes resist film 32 above first pattern 2 with the development liquid, and the subsequent rinsing (S203) substitutes the development liquid filled in the trenches of first pattern 2 with a rinse liquid.

Next, the silicon substrate is chemically treated in a clean step (S204) and oxidation (S205) without being dried. The clean step is carried out in accordance with the third embodiment which is followed by oxidation step. Oxidation is carried out by supplying an oxidation agent from the nozzle. If silicon nitride film 31 or a non-silicon oxide film such as polycrystalline silicon film is provided at the top portion of first pattern 2, the supply of oxidation agent transforms such films. As a result, dangling bonds etc., originating from processes such as RIE, is modified by OH to facilitate the formation of water repellent protective film in the following water repellent treatment.

Thereafter, purified water rinse (S206) and alcoholic rinse (S207) are carried out consecutively without any dry steps as was the case in the third embodiment, which are followed by water repellent treatment (S208). In the water repellent treatment, formation of the water repellent film is promoted above first pattern 2 which has been subjected to the oxidation treatment, thereby allowing the contact angle of the top portion of first pattern 2 to be greater than the contact angle of the top portion of second pattern 4.

Next, alcoholic rinse (S209) and purified water rinse (S210) are executed. First region 3 of silicon substrate 1 in which first pattern 2 is formed is thus, selectively rendered water repellent to increase the contact angle. Pattern collapse induced by surface tension is prevented by carrying out the dry step (S211) after the above described series of steps. Then, an excimer UV process not shown is executed within the surface treatment apparatus after the dry step, to remove the water repellent protective film (S212) and obtain a clean surface. Resist film 32 may be removed by a non-oxidative wet etching prior to the water repellent treatment.

In the above described fourth embodiment, silicon nitride film 31 is formed at the top portion of first and second patterns 2 and 4 and the surface of silicon nitride film 31 of first pattern 2 is selectively oxidized to render silicon nitride film 31 of first pattern 2 more sensitive to the water repellent treatment. Thus, the same silicon nitride film 31 can be controlled to have different contact angles depending upon location to prevent pattern collapse of first pattern 2 in the dry steps as achieved in the previous embodiments. As a result, the first and the second film being made of the same film, i.e. silicon nitride film 31, can be modified to have different contact angles through selective oxidation, to provide an alternative when the process does not allow placement of different types of films.

Next, a description will be given on a fifth embodiment, with reference to FIGS. 11 and 12. The fifth embodiment achieves the surface modification through ion implantation. For instance, it has been verified as indicated in FIG. 12 that implantation of boron (B) ions into a silicon surface significantly reduces the water contact angle of the ion implanted silicon surface to 12 degrees from 78 degrees of an non-implanted silicon surface.

Figure 11:
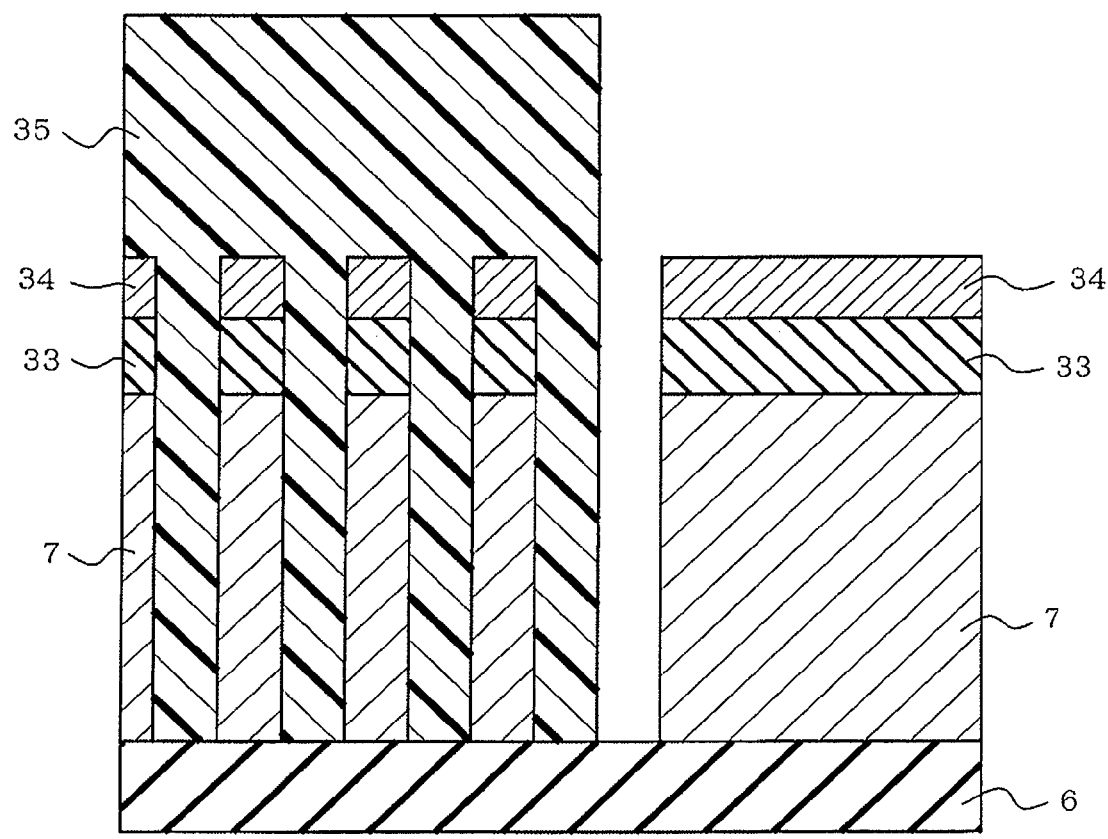
FIG. 11 is a schematic cross sectional view partially illustrating a structure of a fifth embodiment.
Figure 12:
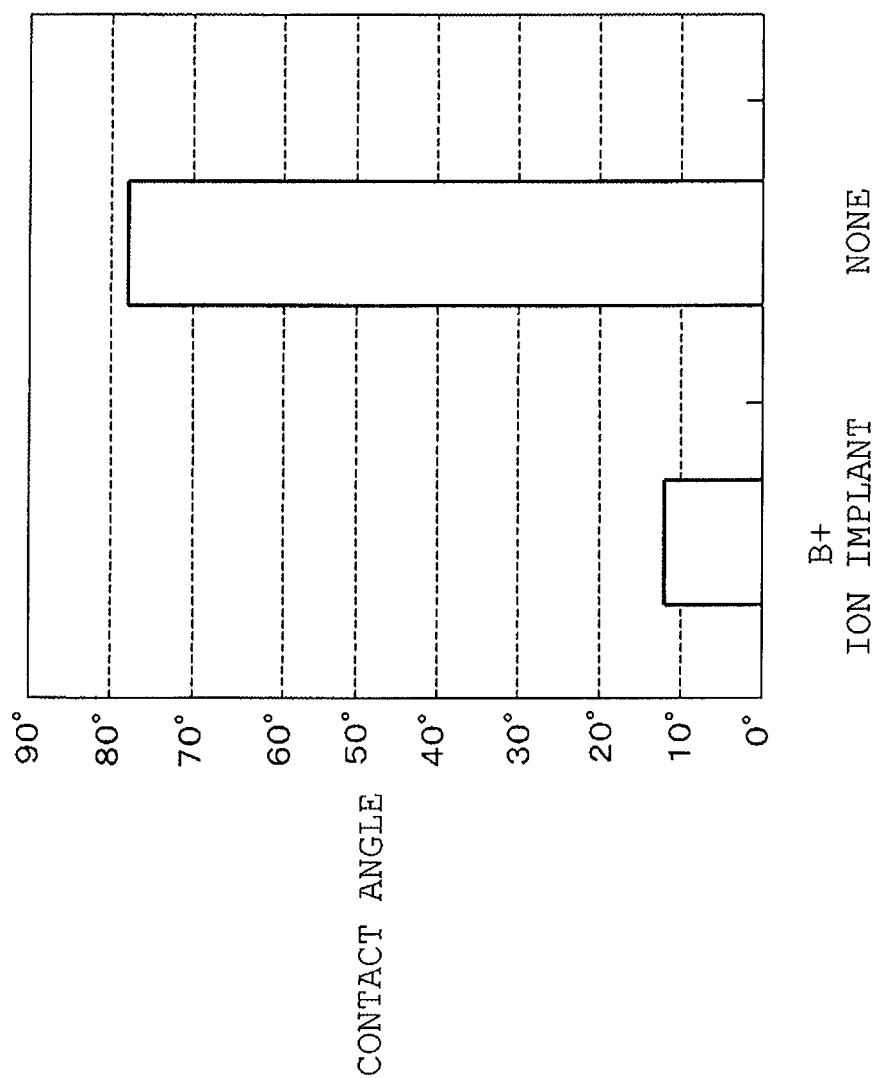
FIG. 12 is a chart indicating the water contact angles of different types of films with or without ion implantation of the fifth embodiment.

FIG. 11 is a cross sectional view of a feature being subjected to ion implantation which is similar in structure to the feature exemplified in the first embodiment. In the fifth embodiment, insulating film 6 typically made of silicon oxide film is formed above a semiconductor substrate such as a silicon substrate, and first and second patterns 2 and 4 are formed above insulating film 6 as was the case in the first embodiment. First and second patterns 2 and 4 include workpiece film 7 typically comprising polycrystalline silicon film, insulating film 33 comprising a silicon oxide film or silicon nitride film 31 formed above workpiece film 7, and further polycrystalline silicon film 34 formed above insulating film 33.

In order to selectively implant ions into polycrystalline silicon film 34 at the top portion of second pattern 4, resist film 35 is coated and patterned to cover first pattern 2. Using resist film 35 as a mask, boron ions are selectively implanted into polycrystalline silicon film 34 of second pattern 4.

Polycrystalline silicon film 34 being subjected to the above described ion implantation causes the top portion of second pattern 4 to selectively reduce its contact angle and thus, functions as the second film. Polycrystalline silicon film 34 at the top portion of first pattern 2 maintains its inherent contact angle and thus, functions as the first film.

Because the continuous cleaning of redeposits by DHF, etc. after the resist removal is carried out after the contact angle of the top portion of first pattern 2 has been controlled to be greater than the contact angle of the top portion of second pattern 4, the dry step can be carried out without encountering pattern collapse induced by surface tension.

The foregoing embodiments may be modified or expanded as follows.

Second region 5 being configured to surround first region 3 on all sides in the foregoing embodiments may be configured to leave one or more sides of first region 3 open as long as second region 5 is located adjacent to region 3 to make chemical liquids and water difficult to remain in the top portion of first pattern 2 and be drawn toward second pattern 4.

The first to fifth embodiments may be selectively applied depending upon the type of the first and the second films to be subjected to the dry step without encountering pattern collapse of the fine first pattern 2.

In case the chemical liquids used in the water repellent treatment of the foregoing embodiments can be substituted directly with water, the alcoholic rinse carried out before and after the water repellent treatment may be omitted.

In the fifth embodiment, the type of ions being implanted for varying the contact angle through surface modification is not limited to boron. In such case, because the desired contact angle can be specified depending upon the type of ions being implanted, pattern collapse of first pattern 2 can be prevented depending upon the type of film being located at the top portion of first pattern 2 or second pattern 4 or the choice of processes that are available.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device including a workpiece structure having a first region and second region located adjacent to the first region formed therein, the first region including a first pattern and the second region including a second pattern having at least a greater pattern width or a smaller aspect ratio than the first pattern, the method comprising:

forming the first pattern by providing a first film having a first contact angle at a top portion thereof and the second pattern by providing a second film having a second contact angle less than the first contact angle at a top portion thereof;

cleaning the first and the second regions by a chemical liquid;

rinsing the cleaned first and the second regions by a rinse liquid; and drying the rinsed first and the second regions.

2. The method according to claim 1, wherein the forming the first and the second patterns includes:

forming, above the workpiece structure, the second film having the second contact angle and the first film having the first contact angle;

patterning the first film, the second film, and the workpiece structure in the first and the second regions;

patterning a resist film, after patterning the first and the second films and the workpiece, so as to cover the first region; and selectively removing the first film exposed in the second region to leave the first film located at a top portion of the first pattern and to cause the second film located at a top portion of the second pattern.

3. The method according to claim 2, wherein the first film comprises one selected from a group of a polycrystalline silicon film, an amorphous silicon film, and a single crystal silicon film, and the second film comprises a silicon oxide film or a silicon nitride film.

4. The method according to claim 2, wherein the first pattern is formed by a sidewall transfer process.

5. The method according to claim 1, wherein forming the first and the second patterns includes:

forming, above the workpiece structure, the first film having the first contact angle and the second film having the second contact angle so as to be thicker than a half of a width of the first pattern, patterning the second film, the first film, and the workpiece structure in the first and the second regions;

isotropically etching the second film, after the patterning, to expose the first film in the first region by removing the second film in the first region while leaving the second film in the second region.

6. The method according to claim 5, wherein the first film comprises a silicon nitride film and the second film comprises a silicon oxide film.

7. The method according to claim 5, wherein isotropically etching the second film comprises wet etching.

8. The method according to claim 1, wherein forming the first and the second patterns includes:

forming a first layer in the first region and the second region above the workpiece structure;

forming a second layer above the first layer so as to be thicker than half a width of the first pattern;

patterning the second layer, the first layer, and the workpiece structure in the first and the second regions;

isotropically etching the patterned second layer to expose the first layer in the first region by removing the second layer from the first region while leaving the second layer in the second region; and selectively performing, using a water repellent agent, a water repellent treatment on the first layer exposed in the first region to obtain the first film having the first contact angle and to obtain the second film having the second contact angle in the second region.

9. The method according to claim 8, wherein the first layer comprises a silicon oxide film and the second layer comprises a silicon nitride film.

10. The method according to claim 8, wherein the water repellent treatment supplies a silane coupling agent onto the first layer to increase a contact angle of the first layer through a silane coupling reaction.

11. The method according to claim 10, wherein the silane coupling reaction is preceded and followed by an alcoholic rinse process.

12. The method according to claim 1, wherein forming the first and the second patterns includes:

forming a non-oxide film at a top portion in the first region and the second region;

patterning the non-oxide film and the workpiece structure in the first and the second regions;

patterning a resist film, after the patterning of the non-oxide film and the workpiece structure, so as to cover the second region and expose the first region;

selectively oxidizing, after the resist film patterning, a surface of the first region exposed from the resist film without drying; and selectively performing, using a water repellent agent, a water repellent treatment on the non-oxide film having been oxidized and exposed in the first region without drying to obtain the first film having the first contact angle in the first region and to obtain the second film having the second contact angle in the second region.

13. The method according to claim 12, wherein the non-oxide film comprises a silicon nitride film.

14. The method according to claim 12, wherein the water repellent treatment supplies a silane coupling agent onto the non-oxide film after oxidizing the non-oxide film to increase a contact angle of the non-oxide film through a silane coupling reaction.

15. The method according to claim 14, wherein the silane coupling reaction is preceded and followed by an alcoholic rinse process.

16. The method according to claim 1, wherein forming the first and the second patterns includes:

forming a modification film at a top portion in the first region and the second region;

patterning the modification film and the workpiece structure in the first region and the second region;

patterning a resist film, after the pattering of the modification film and the workpiece structure, so as to cover the first region and expose the second region; and selectively implanting ions into an exposed surface of the second region to modify a contact angle of the exposed surface of the second region.

17. The method according to claim 16, wherein the modification film comprises a polycrystalline silicon film, and the implanted ions comprise boron ions.

18. The method according to claim 1, wherein the first region serves as a memory cell region for a nonvolatile memory and the first pattern comprises a line and space pattern.

19. The method according to claim 18, wherein the second region comprises a peripheral circuit region surrounding the memory cell region.

20. The method according to claim 18, wherein the first pattern is formed by a sidewall transfer process.

* * * * *